(12) United States Patent
Mao et al.

(10) Patent No.: US 8,922,217 B2
(45) Date of Patent: Dec. 30, 2014

(54) BATTERY STATE-OF-CHARGE OBSERVER

(75) Inventors: Xiaofeng Mao, Warren, MI (US);
Xidong Tang, Royal Oak, MI (US)

(73) Assignee: GM Global Technology Operations LLC, Detroit, MI (US)

(*) Notice: Subject to any disclaimer, the term of this patent is extended or adjusted under 35 U.S.C. 154(b) by 449 days.

(21) Appl. No.: 13/466,394

(22) Filed: May 8, 2012

(65) Prior Publication Data

US 2013/0300190 A1    Nov. 14, 2013

(51) Int. Cl.
  *G01N 27/416* (2006.01)
  *G01R 31/36* (2006.01)
(52) U.S. Cl.
  CPC .................. *G01R 31/3648* (2013.01)
  USPC .......................................... 324/431; 320/132
(58) Field of Classification Search
  CPC ........... G01R 31/3648; G01R 31/3675; G01R 31/3668; G01R 31/006; G01R 31/3627; G01R 31/3662; G01R 31/3631; Y02E 60/12
  USPC ......................................................... 324/431
  See application file for complete search history.

(56) References Cited

U.S. PATENT DOCUMENTS

| | | | |
|---|---|---|---|
| 6,441,586 B1 * | 8/2002 | Tate et al. | 320/132 |
| 6,534,954 B1 * | 3/2003 | Plett | 320/132 |
| 7,593,821 B2 * | 9/2009 | Plett | 702/63 |
| 7,764,049 B2 * | 7/2010 | Iwane et al. | 320/136 |
| 2004/0032264 A1 * | 2/2004 | Schoch | 324/426 |
| 2007/0046292 A1 * | 3/2007 | Plett | 324/429 |
| 2010/0017155 A1 * | 1/2010 | Nareid | 702/63 |
| 2013/0110429 A1 * | 5/2013 | Mitsuyama et al. | 702/63 |

OTHER PUBLICATIONS

Carlos E. de Souza et al., Robust H(Infinity) Filtering for Discrete-Time Linear Systems With Uncertain Time-Varying Parameters, IEEE Transactions on Signal Processing, vol. 54, No. 6, Jun. 2006, pp. 2110-2118.

* cited by examiner

*Primary Examiner* — Arun Williams

(57) ABSTRACT

A robust battery state-of-charge observer determines a state-of-charge as function of an open circuit voltage by taking into account battery parameter uncertainties, which are due to battery age, variation, and operating conditions, (e.g. temperature and SOC level). Each of the time-varying battery parameter values are bounded. By utilizing the parameter variation bounds in the design process and constantly minimizing the estimation error covariance matrix, the robust observer achieves enhanced robustness to the variations of battery age, variation, and operating conditions such as temperature and SOC level.

20 Claims, 2 Drawing Sheets

BATTERY STATE-OF-CHARGE OBSERVER

BACKGROUND OF INVENTION

An embodiment relates generally to determining a state-of-charge of a battery within a transportation vehicle.

A state-of-charge (SOC) refers to a stored charge available to perform work relative to that which is available after the battery has been fully charged. The state-of-charge can be viewed as a thermodynamic quantity, enabling one to assess the potential energy of the system.

Open circuit voltage is used to determine the SOC; however, the accuracy of the open circuit voltage is critical to determining a state of charge and is difficult to estimate during the battery use. If there is measurement error, then the state-of-charge estimation will be in error according to the factor of the measurement error. Moreover, for conventional vehicles and battery systems, the battery must be at rest (i.e., no load or recharging) for a respective duration of time before the open circuit voltage can be obtained. Prior art systems that attempt to estimate the open circuit voltage while the battery is in use are deficient for failing to consider parameter uncertainties such internal resistances, capacitances, and other battery parameters which will vary based on age and temperature of the battery.

SUMMARY OF INVENTION

An embodiment contemplates a method of determining a state-of-charge for a battery while connected to a plurality of loads. A terminal voltage of the battery is measured at a plurality of time steps. A terminal current draw of the battery coinciding with the measured terminal voltage is measured at the plurality of time steps. A temperature of the battery is measured coinciding with the measured terminal voltage at the plurality of time steps. A state vector of a battery system model is generated as a function of battery parameters, the measured voltage, the measured current, and the measured temperature for each time step. The battery parameters include internal battery resistance and capacitance. An estimated state vector is generated as a function of nominal battery system matrices and battery parameter uncertainties for each time step. A stator vector is generated for an augmented system as a function of the state vector of the battery system model and the estimated state vector for each time step. A covariance is generated for the state vector of the augmented system for each time step. An upper bound of the covariance is determined by recursively minimizing the upper bound of the covariance for each time step. An open circuit voltage is determined based on an updated state vector utilizing the minimized upper bound. The state of charge of the battery is determined as a function of the open circuit voltage. The battery is regulated in response to the state of charge.

An embodiment contemplates a diagnostic and control system for a vehicle battery. At least one sensor monitors a parameter characteristic of the vehicle battery while supplying a plurality of loads a plurality of time steps. An electronic control module is coupled to the at least one sensor for receiving parameter characteristic. The electronic control module includes a processing unit for determining an open circuit voltage based on a state vector of a battery system model. The state vector is recursively updated as a function of an estimated state vector of the battery system model for each time step. The estimated state vector is generated as a function of the nominal system matrices of the battery system model and battery parameter uncertainties for each time step. The estimated state vector is updated by minimizing an upper bound of a covariance of a state vector for an augmented system of the battery system model at each time step. The augmented system is generated as a function of the state vector of the battery system model and the estimated state vector of the battery system model at each time step. The control module regulates the vehicle battery in response to a state of charge of the battery as a function of the open circuit voltage.

DETAILED DESCRIPTION

Figure 1:
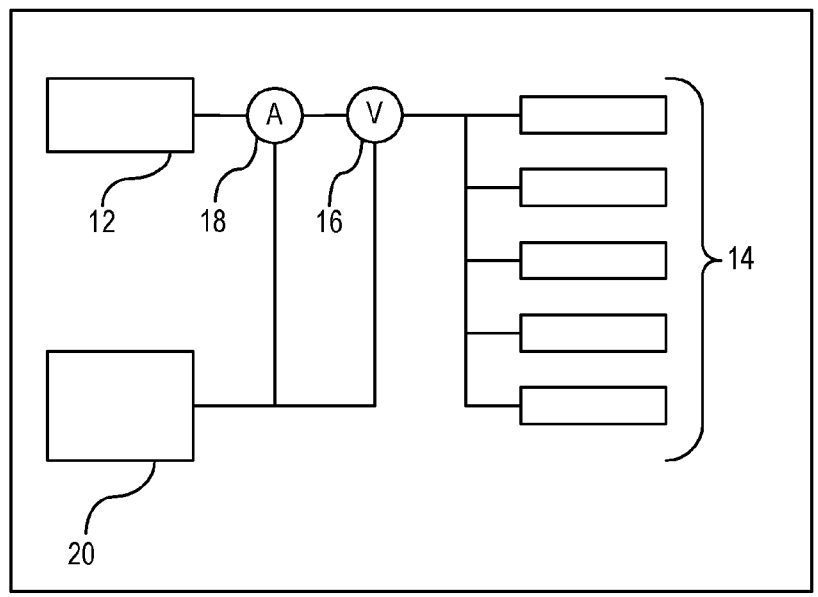
FIG. 1 is a block diagram of an embodiment of a vehicle incorporating a state-of-charge (SOC) estimation system.

FIG. 1 illustrates a block diagram of an embodiment of a vehicle 10 incorporating a state-of-charge (SOC) estimation system. The vehicle 10 includes a battery 12. The battery 12 is preferably a lithium-ion battery; however, it should be understood that other types of batteries may be used herein by modifying a battery system model that will be discussed in detail later. The methodology described herein can determine the state-of-charge of the battery when the battery is in use, as opposed to the battery having to be at rest for a predetermined period of time. The advantages of the proposed methodology over existing techniques are enhanced robustness relative to battery age, battery variations, operating conditions, current sensor noise, and reduced calibration time.

To enhance control of the battery systems in hybrid vehicles for long battery life and good fuel economy, onboard systems determine and process battery parameters such as the open-circuit voltage ($V_{oc}$), the ohmic resistance, the battery capacitance, etc. For example, the $V_{oc}$ is used to estimate the battery state of charge (SOC), which is an index associated with battery condition. However, the $V_{oc}$ and other battery internal parameters are not directly measurable during vehicle operation. Therefore, an efficient and effective technique used to determine the $V_{oc}$ by extracting the battery parameters from measured signals such as battery terminal voltage and current.

The lithium-ion battery is a rechargeable type of battery in which ions move from the negative electrode to the positive electrode during discharge, and back when charging.

There are three primary components of a lithium-ion battery. The primary components are the negative electrode, positive electrode, and the electrolyte. The negative electrode of a conventional lithium-ion cell is made from carbon (e.g., graphite). The positive electrode is a metal oxide and is generally one of three materials: a layered oxide (e.g., lithium cobalt oxide), a polyanion or a spinel (e.g., such as lithium manganese oxide), and the electrolyte is a lithium salt in an organic solvent. The electrolyte is typically a mixture of organic carbonates such as ethylene carbonate or diethyl carbonate containing complexes of lithium ions. The electrochemical roles of the electrodes change between anode and cathode, depending on the direction of current flow through the cell.

During discharge, lithium ions carry current from the negative electrode to the positive electrode. During charging, an external electrical power source applies an over-voltage forcing the current to pass in a reverse direction. The lithium ions then migrate from the positive electrode to the negative electrode. The lithium-ions become embedded in the porous electrode material.

To better enhance a system that utilize lithium ion batteries, such as hybrid electric vehicles, on-board vehicle systems determine and process battery parameters including, but not limited to, open-circuit voltage ($V_{oc}$), the ohmic resistance, and battery capacitance.

The vehicle battery 12 is electrically coupled to a plurality of devices 14 which utilize the battery as a power source. The vehicle 10 may further include a current sensor 16, a voltage meter 18, and a control module 20.

The plurality of devices 14 include, but are not limited to, electrical loads, power outlets adapted to an external device, accessories, components, subsystems, and systems of a vehicle. Moreover, one of the plurality of devices 14 may include an alternator/regulator for recharging the battery 12 or a motor/generator as used in hybrid and electric vehicles. The current sensor 16 is used to monitor the current leaving the vehicle battery 12. The voltmeter 18 measures a voltage so that the $V_{oc}$ may be determined. A control module 20, or similar module, obtains, derives, monitors, and/or processes a set of parameters associated with the vehicle battery 12. These parameters may include, without limitation, current, voltage, state-of-charge (SOC), battery capacity, battery internal resistances, battery internal reactance, battery temperature, and power output of the vehicle battery. The control module 20 includes an algorithm, or like, for executing a vehicle state-of-charge (SOC) estimation technique.

The control module 20 utilizes the $V_{oc}$ of the battery for determining the SOC. It should be understood that the $V_{oc}$ is not directly measurable during vehicle operation. Typically, the $V_{oc}$ may be accurately measured only after the $V_{oc}$ equilibrium is obtained, which occurs a predetermined time after battery charging has been discontinued (i.e., either by an ignition off operation or other charging device). The predetermined time to reach $V_{oc}$ equilibrium is typically about 24 hours after charging the battery is discontinued. That is, an $V_{oc}$ measurement is accurate only when the battery voltage is under the equilibrium conditions. Electrical charges on the surface of the battery's plates cause false voltmeter readings. False voltmeter readings are due to surface charges on the battery plates. When a battery is charged, the surface of the plates may have a higher charge than the inner portions of the plates. After a period of time after charging has been discontinued, the surface charge on the surface of the plates will become slightly discharged as a result of the charged energy penetrating deeper into the plates. Therefore, the surface charge, if not dissipated to the inner portion of the plates, may make a weak battery appear good.

The embodiment described herein provides a technique for estimating an accurate $V_{oc}$ measurement while the battery is in use. The technique described herein extracts battery parameters from measured signals such as battery terminal voltage and current. Moreover, the system models other parameters within the battery circuit such as ohmic resistance parameters and capacitance parameters for determining the $V_{oc}$ while the battery is in use.

To estimate the $V_{oc}$ of the battery, a $V_{oc}$ estimation technique or model is derived from a robust observer that estimates battery states and the $V_{oc}$ by minimizing an upper bound of an estimation error covariance matrix. The $V_{oc}$ is used to determine the SOC, which thereafter can be used to enhance factors including, but not limited to, improve fuel economy, prolonging battery life, enhancing battery charging control and vehicle power management, and reducing warranty cost.

Figure 2:
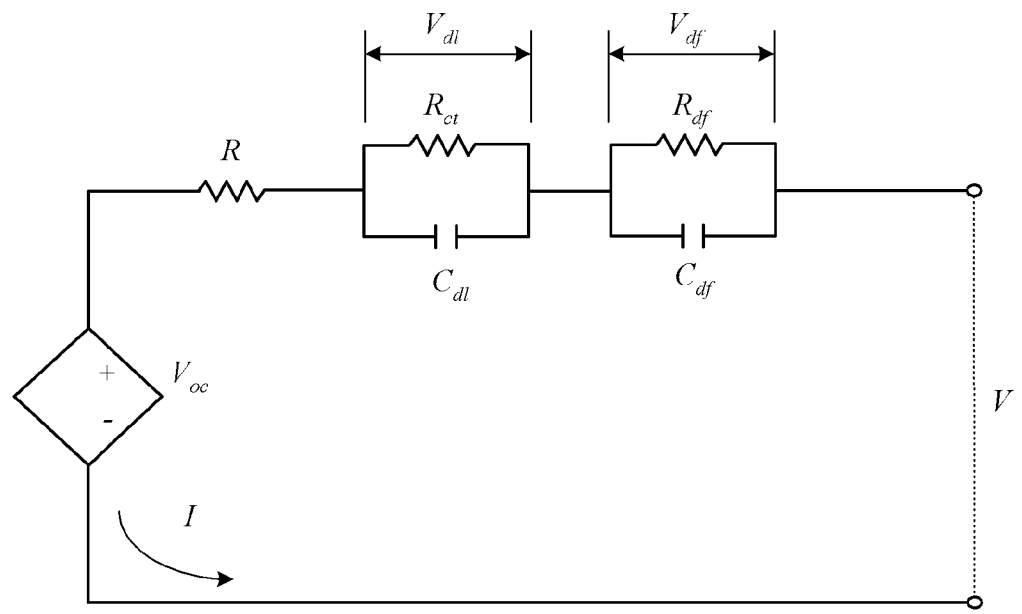
FIG. 2 is a schematic of a two-RC pair equivalent circuit.

FIG. 2 illustrates a two-RC pair equivalent circuit. The following is a model of the two-RC pair equivalent circuit illustrated in FIG. 2. The model is represented by the following matrices:

$$\begin{bmatrix} V_{dl}(k+1) \\ V_{df}(k+1) \\ V_{oc}(k+1) \end{bmatrix} =$$

$$\begin{bmatrix} e^{-T/R_{ct}C_{dl}} & 0 & 0 \\ 0 & e^{-T/R_{df}C_{df}} & 0 \\ 0 & 0 & 1 \end{bmatrix} \begin{bmatrix} V_{dl}(k) \\ V_{df}(k) \\ V_{oc}(k) \end{bmatrix} + \begin{bmatrix} R_{ct}(1-e^{-T/R_{ct}C_{dl}}) \\ R_{df}(1-e^{-T/R_{df}C_{df}}) \\ \mu \end{bmatrix} I(k)$$

$$V(k) = \begin{bmatrix} 1 & 1 & 1 \end{bmatrix} \begin{bmatrix} V_{dl}(k) \\ V_{df}(k) \\ V_{oc}(k) \end{bmatrix} + RI(k)$$

where $\mu$ describes the relationship between $V_{oc}$ and I, $C_{dl}$ is a double layer capacitance of the battery model, $V_{dl}$ is a double layer voltage of the battery model, $R_{ct}$ is a charge transfer resistance of the battery model, $V_{df}$ is a diffusion voltage of the battery model, $C_{df}$ is a capacitance diffusion of the battery model, $R_{df}$ is a diffusion resistance of the battery model, R is the ohmic resistance, T is the sample time, V is the battery terminal voltage, and I is the battery terminal current.

Each of the battery parameters (i.e. $R_{ct}$, $C_{dl}$, $R_{dl}$, $C_{dl}$, $\mu$, and R) in the FIG. 2 are time-varying, depending on battery age, variation, and operating conditions, (e.g. temperature and SOC level). In addition, $\mu$ is a function of battery temperature, battery capacity and SOC. It is also noted that each of these parameters is bounded in practice. As a result, the matrices illustrated above can be rewritten as follows:

$$\begin{bmatrix} V_{dl}(k+1) \\ V_{df}(k+1) \\ V_{oc}(k+1) \end{bmatrix} = (A_k + \Delta A_k) \begin{bmatrix} V_{dl}(k) \\ V_{df}(k) \\ V_{oc}(k) \end{bmatrix} + (B_k + \Delta B_k)I(k)$$

$$V(k) = (C_k + \Delta C_k) \begin{bmatrix} V_{dl}(k) \\ V_{df}(k) \\ V_{oc}(k) \end{bmatrix} + (D_k + \Delta D_k)I(k)$$

where $$A_k = \begin{bmatrix} e^{-T/R_{ct}C_{dl}} & 0 & 0 \\ 0 & e^{-T/R_{df}C_{df}} & 0 \\ 0 & 0 & 1 \end{bmatrix}$$

$$B_k = \begin{bmatrix} R_{ct}(1-e^{-T/R_{ct}C_{dl}}) \\ R_{df}(1-e^{-T/R_{df}C_{df}}) \\ \mu \end{bmatrix}$$

$$C_k = \begin{bmatrix} 1 & 1 & 1 \end{bmatrix}$$

$$D_k = R$$

$A_k$, $B_k$, $C_k$, $D_k$ represent nominal system matrices determined by mean values of all the time-varying parameters. $\Delta A_k$, $\Delta B_k$, $\Delta C_k$, $\Delta D_k$ represent variations of the corresponding system matrices caused by parameter variation/uncertainties. Since all the parameters are bounded, nominal system matrices $\Delta A_k$, $\Delta B_k$, $\Delta C_k$, $\Delta D_k$ can be modeled as norm-bounded terms. Therefore, the norm bounded matrices $\Delta A_k$, $\Delta B_k$, $\Delta C_k$, $\Delta D_k$ can be rewritten into the following form so that the norm bounds are represented by H and G matrices as follows:

$$\begin{bmatrix} \Delta A_k & \Delta B_k \\ \Delta C_k & \Delta D_k \end{bmatrix} = \begin{bmatrix} H_{A,k} & H_{B,k} \\ H_{C,k} & H_{D,k} \end{bmatrix} F_k \begin{bmatrix} G_{x,k} & 0 \\ 0 & G_{I,k} \end{bmatrix} \quad F_k^T F_k \leq I$$

The objective is to recursively estimate $V_{dl}$, $V_{df}$, and $V_{oc}$ at each time step, and then use the estimated $V_{oc}$ to determine a battery SOC utilizing a $V_{oc}$-SOC correlation table that is a function of battery temperature.

First, a state vector of the system model is represented by the expression $x(k) = [V_{dl}(k)\ V_{df}(k)\ V_{oc}(k)]$ at time step k with measured battery voltage $V_k$ and measured battery current $I_k$.

An estimated state vector is determined that is a function of the nominal system matrices and parameter uncertainties. The estimated state vector is represented by the following formula:

$$\hat{x}_{(k+1|k)} = \phi_k \hat{x}_{(k|k-1)} + B_k I_k + K_k(C_k - C_k \hat{x}_{(k|k-1)} - D_k I_k)$$

where $\hat{x}_{(k|k-1)}$ is the estimated state vector at step k based on all the information up to step k−1. Each of the time steps are discrete steps of time. Two unknown matrices, $\phi_k$ and $K_k$, that represent coefficients for the estimation structure need to be determined online at each time step. Both $\phi_k$ and $K_k$ take into consideration uncertainties. To determine $\phi_k$ and $K_k$ at each time step, a state vector of the augmented system $\tilde{x}_k$ is derived. The state vector of the augmented system $\tilde{x}_k$ is represented by a combination of the state vector of the system model and the estimation structure.

$$\tilde{x}_k = \begin{bmatrix} x_k \\ \hat{x}(k|k-1) \end{bmatrix}$$

The state vector of the augmented system $\tilde{x}_k$ contains both real state values and estimated values. The object is to find an upper bound for the covariance matrix of $\tilde{x}_k$ denoted by $P_{(k+1|k)}$, such that:

$$cov\{\tilde{x}_{k+1}\} \leq P_{(k+1|k)}$$

Consequently, if $cov\{\tilde{x}_{k+1}\} \leq P_{(k+1|k)}$, then $\overline{P}_{(k+1|k)}$ can be represented by the following expression:

$$\overline{P}_{(k+1|k)} = [I-I]P_{(k+1|k)}[I-I]^T.$$

Accordingly, $\overline{P}_{(k+1|k)}$ becomes an upper bound of the error covariance on the state estimation as represented by the following formula:

$$cov\{\tilde{x}_{k+1}\} \leq \overline{P}_{(k+1|k)}$$

where $e_{k+1} = x_{k+1} - \hat{x}_{(k+1|k)}$.

In regards to the covariance, the smaller the error variance in the covariance indicates that the estimation accuracy is higher. Therefore, the objective is to minimize the upper bound of the covariance $cov\{\tilde{x}_{k+1}\}$, which is $\overline{P}_{(k+1|k)}$. To minimize the upper bound $\overline{P}_{(k+1|k)}$, the first-order derivatives of the upper bound $\overline{P}_{(k+1|k)}$ are recursively calculated with respect to the unknown matrices $\phi_k$ and $K_k$ to make them equal to zero. The optimal values for the unknown matrices $\phi_k$ and $K_k$ can be determined and used to estimate the $V_{oc}$. The SOC is thereafter determined utilizing a $V_{oc}$-SOC lookup table as a function of the measured temperature.

Figure 3:
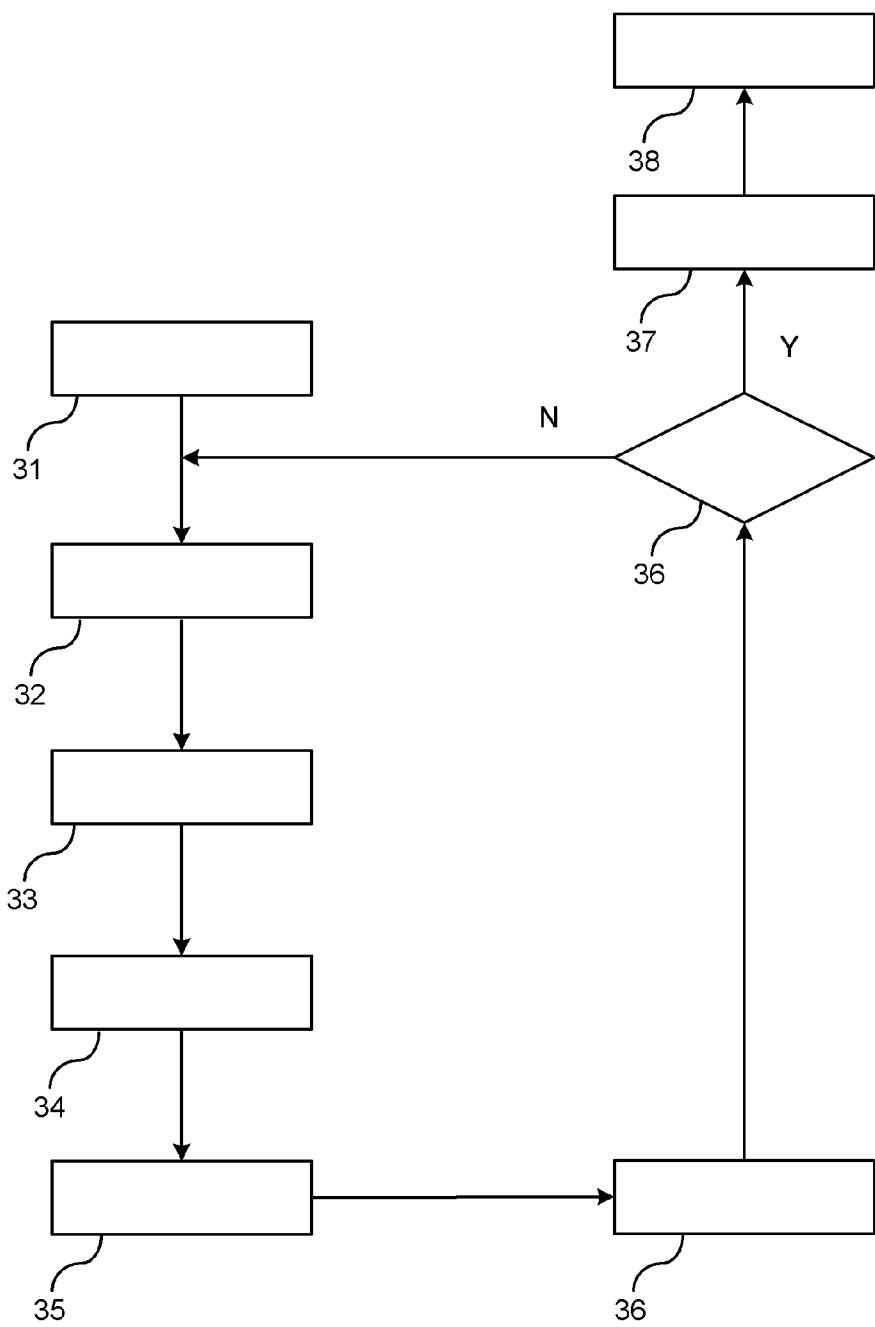
FIG. 3 a flow chart for illustrating a process flow of a robust observer for determining the state-of-charge.

FIG. 3 illustrates a flow chart for illustrating the process flow of the robust observer.

In block 30, at step k=0, the initial conditions are set. The initial conditions are as follows:

$$\hat{x}_{0|-1} = \hat{x}_0 \text{ and } \overline{P}_{0|-1} = X_0.$$

where $\hat{x}_{0|-1}$ is the initial values for the estimated state variables, $\overline{P}_{0|-1}$ is the initial values of the upper bound of error covariance, and $X_0$ is the initial state vector at the first time step are some constant matrices to be used as initial condition.

In block 31, voltage, current, and temperature measurements are recorded.

In block 32, tolerance levels $a_{x,k}$ and $a_{I,k}$ are set for uncertainties and measurement noise. That is, scalar parameters $a_{x,k}$ and $a_{I,k}$ are selected that satisfy the following inequalities.

$$a_{x,k}^{-1}I - G_{x,k}\overline{P}_{k|k-1}G_{x,k}^T > 0,$$

$$a_{x,k}^{-1}I - G_{I,k}W_k G_{I,k}^T > 0,$$

where $W_k$ is variance noise, and each G term-designation is a representation of the norm bound. The selection of $a_{x,k}$ and $a_{I,k}$ is to satisfy the above inequalities for guaranteeing that $cov\{\tilde{x}_{k+1}\} \leq \overline{P}_{(k+1|k)}$ holds true. Since $\overline{P}_{(k+1|k)}$ is a function of $a_{x,k}$ and $a_{I,k}$, then the scalar parameters $a_{x,k}$ and $a_{I,k}$ can also be viewed as a tolerance levels which determine how tight the upper bound is.

In block 33, unified tolerance levels are calculated. The uniform tolerance levels are represented by the following formulas:

$$\Delta_{1,k} = \alpha_{x,k}^{-1} H_{A,k} H_{C,k}^T + \alpha_{I,k}^{-1} H_{B,k} H_{D,k}^T$$

$$\Delta_{2,k} = \alpha_{x,k}^{-1} H_{C,k} H_{C,k}^T + \alpha_{I,k}^{-1} H_{D,k} H_{D,k}^T$$

$$\Delta_{3,k} = \alpha_{x,k}^{-1} H_{A,k} H_{A,k}^T + \alpha_{I,k}^{-1} H_{B,k} H_{B,k}^T.$$

In block 34, the covariance matrices are corrected due to the presence of uncertainties and measurement noise at a current time step. The formulas for determining the correction to the covariance matrices are as follows:

$$\overline{P}_{c,k|k-1} = \overline{P}_{k|k-1} + \overline{P}_{k|k-1} G_{I,k}^T (\alpha_{x,k}^{-1} I - G_{x,k} \overline{P}_{k|k-1} G_{x,k}^T)^{-1} G_{x,k} \overline{P}_{k|k-1}$$

$$W_{c,k} = W_k + W_k G_{I,k}^T (\alpha_{I,k}^{-1} I - G_{I,k} W_k G_{I,k}^T)^{-1} G_{x,k} W_k.$$

The above $\Delta_{1,k}$, $\Delta_{2,k}$, $\Delta_{3,k}$, $\overline{P}_{c,k|k-1}$, and $W_{c,k}$ are terms due to the presence of uncertainties, and such terms are utilized in the expression of $\phi_k$ and $K_k$ as shown below.

In block 35, the observer gains for $\phi_k$ and $K_k$ are determined. The following formulas represent the equations for determining the undefined matrices for observer gains $\phi_k$ and $K_k$.

$$K_k = (A\overline{P}_{c,k|k-1} C_k^T + B_k W_{c,k} D_k^T + \Delta_{I,k})(C_k \overline{P}_{c,k|k-1} C_k^T + D_k W_{c,k} D_k^T + \Delta_{2,k})^{-1}$$

$$\Phi_k = A_k + (A_k - K_k C_k) \overline{P}_{k|k-1} G_{x,k}^T (\alpha_{x,k}^{-1} I - G_{x,k} \overline{P}_{k|k-1} G_{x,k}^T)^{-1} G_{x,k}.$$

In block 36, the observed states and the covariance matrix are updated based on the calculated observer gains calculated in block 35. The observer gains as calculated for $\phi_k$ and $K_k$ are input to the following equations for updating the observed state of the estimated state vector and the associated covariance matrix:

$$\hat{x}_{(k+1|k)} = \phi_k \hat{x}_{(k|k-1)} + B_k I_k + K_k(V_k - C_k \hat{x}_{(k|k-1)} - D_k I_k)$$

$$\overline{P}_{(k+1|k)} = A_k \overline{P}_{c,k|k-1} A_k^T + B_k W_{c,k} B_k^T + \Delta_{3,k} - (A_k \overline{P}_{c,k|k-1} C_k^T + \Delta_{1,k}) x (C_k \overline{P}_{c,k|k-1} C_k^T + D_k W_{c,k} D_k^T + \Delta_{2,k})^{-1} (A_k \overline{P}_{c,k|k-1} C_k^T + \Delta_{1,k})^T.$$

In block 37, a determination is made as to whether all time steps have been checked. If the more time steps are available, then the routine proceeds to step 31 for refining the estimated state vector and the associated covariance matrix. If the determination is made that no additional time steps remain, then the routine proceeds to step 38.

In step 38, the estimated state vector $\hat{x}_{(k+1|k)}$ at the $k_{th}$ step is used as the state vector x(k). The $V_{oc}$ is determined utilizing the expression described earlier $x(k)=[V_{dl}(k)\ V_{df}(k)\ V_{oc}(k)]$. Given the state vector as determined from the estimated state vector at the $k_{th}$ step, the $V_{oc}$ can easily be ascertained by identifying the third entry of the state vector (i.e., the estimated state vector at the $k_{th}$ step).

In step 39, in response to determining the $V_{oc}$, the SOC can be determined from a lookup table that is a function of the $V_{oc}$-SOC. The $V_{oc}$-SOC lookup table provides respective $V_{oc}$ values that correlate to the respective SOC values.

While certain embodiments of the present invention have been described in detail, those familiar with the art to which this invention relates will recognize various alternative designs and embodiments for practicing the invention as defined by the following claims. For example, the invention described herein can be applied to all kinds of batteries by only changing the model.

What is claimed is:

1. A method of determining a state-of-charge for a battery while connected to a plurality of loads, the method comprising the steps of:

measuring a terminal voltage of the battery at a plurality of time steps;

measuring a terminal current draw of the battery coinciding with the measured terminal voltage at the plurality of time steps;

measuring a temperature of the battery coinciding with the measured terminal voltage at the plurality of time steps;

generating a state vector of a battery system model as a function of battery parameters, the measured voltage, the measured current, and the measured temperature for each time step, the battery parameters including internal battery resistance and capacitance;

generating an estimated state vector as a function of nominal battery system matrices and battery parameter uncertainties for each time step;

generating a stator vector for an augmented system as a function of the state vector of the battery system model and the estimated state vector for each time step;

generating a covariance for the state vector of the augmented system for each time step;

determining an upper bound of the covariance by recursively minimizing the upper bound of the covariance for each time step;

determining an open circuit voltage based on an updated state vector utilizing the minimized upper bound;

determining the state of charge of the battery as a function of the open circuit voltage; and regulating the battery in response to the state of charge.

2. The method of claim 1 wherein the battery system model utilizes a two-RC pair equivalent circuit model, wherein the circuit model is represented by the formula:

$$V = V_{oc} + IR + V_{dl} + V_{df}$$

where $V_{oc}$ is the open circuit voltage, $V_{dl}$ is a double layer voltage, $V_{df}$ is a diffuse voltage, I is a terminal battery current, and R is an ohmic resistance.

3. The method of claim 2 wherein the battery system model is transformed into discrete counterparts.

4. The method of claim 3 wherein the transformed battery system model is represented by the following matrices:

$$\begin{bmatrix} V_{dl}(k+1) \\ V_{df}(k+1) \\ V_{oc}(k+1) \end{bmatrix} =$$

$$\begin{bmatrix} e^{-T/R_{ct}C_{dl}} & 0 & 0 \\ 0 & e^{-T/R_{df}C_{df}} & 0 \\ 0 & 0 & 1 \end{bmatrix} \begin{bmatrix} V_{dl}(k) \\ V_{df}(k) \\ V_{oc}(k) \end{bmatrix} + \begin{bmatrix} R_{ct}(1-e^{-T/R_{ct}C_{dl}}) \\ R_{df}(1-e^{-T/R_{df}C_{df}}) \\ \mu \end{bmatrix} I(k)$$

$$V(k) = \begin{bmatrix} 1 & 1 & 1 \end{bmatrix} \begin{bmatrix} V_{dl}(k) \\ V_{df}(k) \\ V_{oc}(k) \end{bmatrix} + RI(k)$$

where $\mu$ describes the relationship between $V_{oc}$ and I, $C_{dl}$ is a double layer capacitance, $V_{dl}$ is a double layer voltage of the battery system model, of the battery system model, $R_{ct}$ is a charge transfer resistance of the battery system model, $V_{df}$ is a diffusion voltage of the battery system model, $C_{df}$ is a capacitance diffusion of the battery system model, $R_{df}$ is a diffusion resistance of the battery system model, R is the ohmic resistance, T is the sample time, V is the battery terminal voltage, and I is the battery terminal current.

5. The method of claim 4 wherein the parameters of the battery system model are bounded and are represented by the following formula:

$$\begin{bmatrix} V_{dl}(k+1) \\ V_{df}(k+1) \\ V_{oc}(k+1) \end{bmatrix} = (A_k + \Delta A_k) \begin{bmatrix} V_{dl}(k) \\ V_{df}(k) \\ V_{oc}(k) \end{bmatrix} + (B_k + \Delta B_k)I(k)$$

$$V(k) = (C_k + \Delta C_k) \begin{bmatrix} V_{dl}(k) \\ V_{df}(k) \\ V_{oc}(k) \end{bmatrix} + (D_k + \Delta D_k)I(k)$$

where $$A_k = \begin{bmatrix} e^{-T/R_{ct}C_{dl}} & 0 & 0 \\ 0 & e^{-T/R_{df}C_{df}} & 0 \\ 0 & 0 & 1 \end{bmatrix},$$

$$B_k = \begin{bmatrix} R_{ct}(1-e^{-T/R_{ct}C_{dl}}) \\ R_{df}(1-e^{-T/R_{df}C_{df}}) \\ \mu \end{bmatrix},$$

$$C_k = \begin{bmatrix} 1 & 1 & 1 \end{bmatrix},$$

$$D_k = R$$

where $A_k$, $B_k$, $C_k$, $D_k$ are nominal system matrices, and $\Delta A_k$, $\Delta B_k$, $\Delta C_k$, $\Delta D_k$ are variations in each of the corresponding system matrices caused by parameter variation.

6. The method of claim 5 wherein the variations are norm bounded, and wherein the variations are represented as norm bound matrices as follows:

$$\begin{bmatrix} \Delta A_k & \Delta B_k \\ \Delta C_k & \Delta D_k \end{bmatrix} = \begin{bmatrix} H_{A,k} & H_{B,k} \\ H_{C,k} & H_{D,k} \end{bmatrix} F_k \begin{bmatrix} G_{x,k} & 0 \\ 0 & G_{I,k} \end{bmatrix} \quad F_k^T F_k \leq I$$

where $\Delta A_k$, $\Delta B_k$, $\Delta C_k$, $\Delta D_k$ are uncertainties in each of the corresponding system matrices caused by parameter variation, $H_{A,k}, H_{B,k}, H_{C,k}, H_{C,k}$ are matrices defining the norm bounds of $\Delta A_k, \Delta B_k, \Delta C_k, \Delta D_k, G_{I,k}$ are other matrices which can limit the norm bounds of $\Delta A_k, \Delta B_k, \Delta C_k, \Delta D_k$; Typically $G_{x,k}, G_{I,k}$ can be chosen as identity matrices, and $F_k$ is any matrix satisfying $F_k^T F_k$.

7. The method of claim 6 wherein generating the state vector of the battery system model is represented by the following formula:

$$x(k) = [V_{dl}(k) V_{df}(k) V_{oc}(k)].$$

8. The method of claim 7 wherein generating the estimated state vector for the battery system model is represented by the following formula:

$$\hat{x}_{(k+1|k)} = \phi_k \hat{x}_{(k|k-1)} + B_k I_k + K_k(V_k - C_k \hat{x}_{(k|k-1)} - D_k I_k)$$

where $\hat{x}_{(k|k-1)}$ is an estimated state vector at step k based on all the information up to step k−1, $I_k$ is a measured current at time step k, $V_k$ is a measured voltage at time step k, and observer gains $\phi_k$ and $K_k$ are unknown matrices determined online at each time step.

9. The method of claim 8 wherein the upper bound of the covariance is calculated utilizing first-order partial derivatives of the upper bound with respect to $\phi_k$ and $K_k$ at each time step.

10. The method of claim 9 wherein observer gains $\phi_k$ and $K_k$ are represented by the following expressions:

$$K_k = (A\overline{P}_{c,k|k-1} C_k^T + B_k W_{c,k} D_k^T + \Delta_{I,k})(C_k \overline{P}_{c,k|k-1} C_k^T + D_k W_{c,k} D_k^T + \Delta_{2,k})^{-1}$$

$$\Phi_k = A_k + (A_k - K_k C_k)\overline{P}_{k|k-1} G_{x,k}^T (\alpha_{x,k}^{-1} I - G_{x,k} \overline{P}_{k|k-1} G_{x,k}^T)^{-1} G_{x,k}$$

where $\overline{P}_{c,k|k-1}$, and $W_{c,k}$ are formulas for determining corrections to the covariance, and T is the measured temperature for a respective time step.

11. The method of claim 10 wherein the state vector of the augmented system is represented by the following expression:

$$\tilde{x}_k = \begin{bmatrix} x_k \\ \hat{x}(k \mid k-1) \end{bmatrix}$$

where $\tilde{x}_k$ is the state vector of the augmented system, $x_k$ is the state vector of the battery system model, and $\hat{x}_{(k|k-1)}$ is the estimated state vector of the battery system model at step k based on all the information up to step k−1.

12. The method of claim 11 wherein $\overline{P}_{(k+1|k)}$ is the upper bound of the augmented system, and wherein $\overline{P}_{(k+1|k)}$ becomes an error covariance matrix of the estimated state vector and is represented by the following formula:

$$\text{cov}\{\tilde{x}_{k+1}\} \le \overline{P}_{(k+1|k)}$$

where $e_{k+1} = x_{k+1} - \hat{x}_{(k+1|k)}$.

13. The method of claim 1 further comprising the step of outputting the state of charge of the battery to an output device for displaying the state-of-charge to a user of a vehicle.

14. The method of claim 1 wherein the regulatory step comprises outputting the state of charge of the battery to an electronic control unit for regulating the battery terminal voltage.

15. The method of claim 1 wherein the regulating step comprises outputting the state of charge of the battery to an electronic control unit for improving fuel economy of a vehicle.

16. A diagnostic and control system for a vehicle battery comprising:

at least one sensor for monitoring a parameter characteristic of the vehicle battery while supplying a plurality of loads a plurality of time steps; and an electronic control module coupled to the at least one sensor for receiving parameter characteristic, the electronic control module including a processing unit for determining an open circuit voltage based on a state vector of a battery system model, the state vector being recursively updated as a function of an estimated state vector of the battery system model for each time step, the estimated state vector being generated as a function of the nominal system matrices of the battery system model and battery parameter uncertainties for each time step, the estimated state vector being updated by minimizing an upper bound of a covariance of a state vector for an augmented system of the battery system model at each time step, wherein the augmented system is generated as a function of the state vector of the battery system model and the estimated state vector of the battery system model at each time step;

wherein the control module regulates the vehicle battery in response to a state of charge of the battery as a function of the open circuit voltage.

17. The system of claim 16 wherein the battery system model is transformed into discrete counterparts and is represented by the following expression:

$$\begin{bmatrix} V_{dl}(k+1) \\ V_{df}(k+1) \\ V_{oc}(k+1) \end{bmatrix} =$$

$$\begin{bmatrix} e^{-T/R_{ct}C_{dl}} & 0 & 0 \\ 0 & e^{-T/R_{df}C_{df}} & 0 \\ 0 & 0 & 1 \end{bmatrix} \begin{bmatrix} V_{dl}(k) \\ V_{df}(k) \\ V_{oc}(k) \end{bmatrix} + \begin{bmatrix} R_{ct}(1 - e^{-T/R_{ct}C_{dl}}) \\ R_{df}(1 - e^{-T/R_{df}C_{df}}) \\ \mu \end{bmatrix} I(k)$$

$$V(k) = \begin{bmatrix} 1 & 1 & 1 \end{bmatrix} \begin{bmatrix} V_{dl}(k) \\ V_{df}(k) \\ V_{oc}(k) \end{bmatrix} + RI(k)$$

where μ describes the relationship between $V_{oc}$ and I, $C_{dl}$ is a double layer capacitance, $V_{dl}$ is a double layer voltage of the battery model, of the battery model, $R_{ct}$ is a charge transfer resistance of the battery model, $V_{df}$ is a diffusion voltage of the battery model, $C_{df}$ is a capacitance diffusion of the battery model, $R_{df}$ is a diffusion resistance of the battery model, R is an ohmic resistance, T is the sample time, V is the battery terminal voltage, and I is the battery terminal current.

18. The system of claim 17 wherein parameters of the battery system model are bounded and are represented by the following expression:

$$\begin{bmatrix} V_{dl}(k+1) \\ V_{df}(k+1) \\ V_{oc}(k+1) \end{bmatrix} = (A_k + \Delta A_k) \begin{bmatrix} V_{dl}(k) \\ V_{df}(k) \\ V_{oc}(k) \end{bmatrix} + (B_k + \Delta B_k) I(k)$$

$$V(k) = (C_k + \Delta C_k) \begin{bmatrix} V_{dl}(k) \\ V_{df}(k) \\ V_{oc}(k) \end{bmatrix} + (D_k + \Delta D_k) I(k)$$

where $$A_k = \begin{bmatrix} e^{-T/R_{ct}C_{dl}} & 0 & 0 \\ 0 & e^{-T/R_{df}C_{df}} & 0 \\ 0 & 0 & 1 \end{bmatrix},$$

$$B_k = \begin{bmatrix} R_{ct}(1 - e^{-T/R_{ct}C_{dl}}) \\ R_{df}(1 - e^{-T/R_{df}C_{df}}) \\ \mu \end{bmatrix},$$

$$C_k = [1 \quad 1 \quad 1],$$

$$D_k = R$$

where $A_k$, $B_k$, $C_k$, $D_k$ are nominal system matrices, and $\Delta A_k$, $\Delta B_k$, $\Delta C_k$, $\Delta D_k$ are variations in each of the corresponding system matrices caused by parameter variation.

19. The system of claim 18 wherein the estimated state vector of the battery system model is represented by the following formula:

$$\hat{x}_{(k+1|k)} = \phi_k \hat{x}_{(k|k-1)} + B_k I_k + K_k(V_k - C_k \hat{x}_{(k|k-1)} - D_k I_k)$$

where $\hat{x}_{(k|k-1)}$ is an estimated state vector at step k based on all the information up to step k−1, $I_k$ is a measured current at time step k, $V_k$ is a measured voltage at time step k, and $\phi_k$ and $K_k$ unknown matrices determined online at time step k.

20. The system of claim 16 further comprising a display device, wherein the state of charge of the battery is displayed to a user.

\* \* \* \* \*